(12) United States Patent
Vasilyuk

(10) Patent No.: US 9,053,015 B2
(45) Date of Patent: Jun. 9, 2015

(54) NAND FLASH MEMORY INTERFACE CONTROLLER WITH GNSS RECEIVER FIRMWARE BOOTING CAPABILITY

(71) Applicant: Nikolay Vasilyuk, Moscow (RU)

(72) Inventor: Nikolay Vasilyuk, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 102 days.

(21) Appl. No.: 14/117,046

(22) PCT Filed: Jun. 17, 2013

(86) PCT No.: PCT/RU2013/000499
§ 371 (c)(1),
(2) Date: Nov. 12, 2013

(87) PCT Pub. No.: WO2014/204331
PCT Pub. Date: Dec. 24, 2014

(65) Prior Publication Data
US 2014/0372670 A1      Dec. 18, 2014

(51) Int. Cl.
G06F 12/02      (2006.01)
G11C 7/20       (2006.01)
G06F 3/06       (2006.01)

(52) U.S. Cl.
CPC ............. *G06F 12/0246* (2013.01); *G11C 7/20* (2013.01); *G06F 3/0632* (2013.01)

(58) Field of Classification Search
CPC .... G06F 12/0246; G06F 3/0632; G06F 12/02
USPC ..................... 711/103, 154; 713/1, 2; 714/52; 365/185.33
See application file for complete search history.

(56) References Cited

U.S. PATENT DOCUMENTS

| 7,490,177 | B2 * | 2/2009  | Kao ................................ 710/22 |
| 7,613,880 | B2 * | 11/2009 | Miura et al. .................. 711/115 |
| 7,908,466 | B2 * | 3/2011  | Oh et al. ........................... 713/1 |
| 7,991,954 | B2 * | 8/2011  | Miura et al. .................. 711/115 |
| 8,108,641 | B2 * | 1/2012  | Goss et al. .................... 711/163 |
| 8,185,687 | B2 * | 5/2012  | Matsuyama et al. .......... 711/103 |

(Continued)

FOREIGN PATENT DOCUMENTS

GB        2430512       3/2007

OTHER PUBLICATIONS

Search report in PCT/RU2013/000499, dated Mar. 19, 2014, pp. 1-7.

*Primary Examiner* — Stephen Elmore
(74) *Attorney, Agent, or Firm* — Bardmesser Law Group

(57) ABSTRACT

An architecture of a NAND Flash memory module interface controller (NAND-controller) provides access to data stored in an external NAND Flash memory module, and a method of booting firmware. NAND-controller automatically boots firmware from the NAND Flash memory into primary RAM of a system-on-a chip used for GNSS receivers. NAND-controller has a first external interface to connect NAND Flash memory, a second external interface to set parameters of booting firmware, and two internal interfaces: a high-speed one (system interface) and a low-speed one (control interface) to be connected to two types of SoC internal busses. Data exchange between the CPU and NAND Flash memory is implemented using a static RAM buffer which is a part of the NAND-controller and available for reading and writing via high-speed interface. Parameters of the first external interface are set and current state of data exchange process is controlled by the CPU.

8 Claims, 6 Drawing Sheets

(56) References Cited

U.S. PATENT DOCUMENTS

| | | | |
|---|---|---|---|
| 8,185,690 B2* | 5/2012 | Miura et al. | 711/115 |
| 8,185,728 B2* | 5/2012 | Lee et al. | 713/2 |
| 8,307,148 B2* | 11/2012 | Rogers et al. | 711/103 |
| 8,341,311 B1* | 12/2012 | Szewerenko et al. | 710/22 |
| 8,423,753 B2* | 4/2013 | Hsu et al. | 713/1 |
| 8,656,089 B2* | 2/2014 | Hsu et al. | 711/103 |
| 8,667,213 B2* | 3/2014 | Rogers et al. | 711/103 |
| 8,990,474 B2* | 3/2015 | Ball | 711/102 |
| 8,990,475 B2* | 3/2015 | Meir et al. | 711/103 |
| 2005/0204091 A1* | 9/2005 | Kilbuck et al. | 711/103 |
| 2007/0211559 A1 | 9/2007 | Choi et al. | |
| 2007/0226795 A1* | 9/2007 | Conti et al. | 726/22 |
| 2008/0104311 A1* | 5/2008 | Meir et al. | 711/103 |
| 2010/0017556 A1* | 1/2010 | Chin et al. | 711/103 |
| 2010/0169546 A1* | 7/2010 | Van Acht et al. | 711/103 |
| 2011/0191529 A1* | 8/2011 | Matsuyama et al. | 711/103 |
| 2012/0185639 A1* | 7/2012 | Hsu et al. | 711/103 |
| 2013/0111113 A1 | 5/2013 | Harari et al. | |
| 2014/0047162 A1* | 2/2014 | Tanimoto et al. | 711/103 |

* cited by examiner

NAND FLASH MEMORY INTERFACE CONTROLLER WITH GNSS RECEIVER FIRMWARE BOOTING CAPABILITY

BACKGROUND OF THE INVENTION

1. Field of the Invention

The present invention relates to devices and methods of exchanging data, and, in particular, to systems of data exchanging between system-on-a-chip (SoC) and non-volatile NAND Flash memory with sequential access and loading of firmware for system-on-a-chip of a GNSS receiver from this memory.

2. Discussion of the Related Art

A typical system-on-a-chip (SoC), including an SoC of a GNSS receiver, is a microchip based on a silicon die. One or more processing cores (PC) with different purposes (e.g., CPU, DSP), an internal volatile RAM, target Intellectual Property cores (IP-cores) and peripheral interface controllers IP-cores which served for interacting SoC with external devices, are located on the die. One or more internal busses are used to connect cores in the SoC one to another.

Information needed for SoC operation is stored, as rule, in nonvolatile memory capable of saving the information when power is off. The most efficient type of nonvolatile memory available on the market at the moment is NAND Flash memory. A distinguishing feature of the NAND Flash memory is its sector organization, i.e., data writing and reading is executed by continuous blocks of a fixed size (sectors). The sector in NAND Flash memory array can have two parts: the main part, and additional ones. The main sector part, with a size from 512 up to 2048 bytes, is intended for data storage. The additional part, with a size of a few tens of bytes, is used to keep extra information related to the content of the main part. The additional part can store a check sum of the main division content, including error correction code, sector's file system mark, and so on.

In manufacturing large-capacity NAND Flash memory modules, a manufacturer does not individually test each sector of each produced module to detect bad memory elements. Manufacturers guarantee only a maximum number of bad elements that is not to be exceeded in each individual module of specific capacity and type. The location of these bad elements within the array of storage elements is not specified. Most manufacturers of NAND Flash also guarantee that one sector (typically, it is the sector with address 0x00) has no bad storage elements after each NAND Flash module has been produced and packaged. This means that the probability of no failures for this sector after the first operation of data recording made with adherence to the specified technological limitations is close to 100%.

It should be noted that external access to a separate data element (byte, word, etc) inside a sector of the memory module is impossible for most NAND Flash modules. Some manufacturers provide such access in NAND Flash microchips thanks to enhancements of the controller built into the NAND Flash module, integration of extra buffer RAMs, and incorporation of special commands for address access to particular bytes, into NAND Flash control instructions.

Capabilities of hardware protection for data stored in the NAND Flash elements from accidental erasure or overwriting are very limited. As rule, such protection is implemented as an input hardware signal Write Protect (WP) which is a part of the external interface of a NAND Flash memory module. When activated, the WP signal inhibits any writing or erasing command for the entire array of storage elements inside the module, making it possible only to read the contents.

The contents of each sector is read or written in the NAND Flash memory module as sequential messages, whose bit size matches the physical width of the bidirectional data bus in the NAND Flash memory module. An initial address in the memory array, starting, from which the read or written sector is located, is transmitted via the same bus. This access method is called the sequential access to a data array.

Sequential access is different from random access, which allows addressing arbitrary separate elements of the memory array (bytes, words, etc.), the elements being read or written in a random order. Most CPUs can directly work only with random access memory which has physically separated address and data busses, for example internal RAM of a SoC. The NAND controller, which is between the SoC bus and NAND Flash memory module, provides the CPU with addressing to NAND Flash memory with sequential access. The NAND-controller is designed for generating a sequence of commands, addresses and auxiliary signals needed for addressing NAND Flash memory module, as well as for converting a data block from a random access format into sequential access format to write/read information to/from NAND Flash and vice versa (from a sequential access format into a random access format).

The SoC CPU starts operating when the active level of the CPU restart signal, generated earlier from both internal and external devices within SoC, has been cleared. The CPU executes program code, which is at the address of the system bus starting from a previously-assigned address. This code (with the corresponding starting address) can be located both in the random access ROM connected to the system bus and in a volatile RAM. In the latter case, the volatile RAM should have proper firmware (execution code) written to it by the time the CPU starts operation. The code should be located starting from a pre-defined address. The procedure of copying the execution code is called the SoC booting routine.

FW (firmware) booting routine implemented in most modern systems-on-a-chip can be described as a combination of two possible approaches to executing this procedure. The first one uses a ROM module with random access in the SoC, which is connected to the system bus and contains the booting code. As soon as the active level of the restart signal is cleared, the CPU executes code from the address space of the module, which controls copying a target FW from external or internal nonvolatile memory into internal RAM. After completing the copy process, the CPU starts executing the target FW from its internal RAM.

The second approach connects a special booting module with a finite-state machine (FSM) to the SoC system bus. The FSM takes control over the interface IP-core with nonvolatile memory and copies target FW from the nonvolatile memory into an internal SoC RAM. In the process of copying, the booting module keeps the CPU in the reset state by setting the restart signal to an active state. The active level of the CPU restart signal is cleared after copy operation has been completed, and then the CPU starts executing the code of the target FW from the internal RAM.

SUMMARY OF THE INVENTION

The present invention is related to an IP-core of the peripheral interface controller (NAND-controller) that provides for connecting NAND Flash memory modules and accessing stored data. It is capable of booting target FW from these memory modules and protecting the assigned address space area in the NAND Flash memory module from accidental erasure/overwriting. The NAND-controller is designed, e.g., for integrating with the system-on-a-chip of a GNSS receiver, where it is connected to one or more internal busses of the SoC.

In one embodiment, an architecture of a NAND-controller which provides access to data stored in an external NAND Flash memory module and a method of booting firmware (FW) is proposed. The NAND-controller automatically boots firmware from the NAND Flash memory into RAM of a system-on-a chip used for GNSS receivers. A NAND-controller has the first external interface to connect NAND Flash memory, the second external interface to set parameters of booting FW, and two internal interfaces: system one (high-speed) and control one (low-speed) to be connected to two types of SoC internal busses. One example of a high-speed interface is AMBA High-performance Bus (AHB) interface. An example of a low-speed interface is AMBA Peripheral Bus (APB) interface. Data exchange between the CPU and NAND Flash memory is implemented using a static RAM buffer which is a part of the NAND-controller and available for reading and writing via system interface. Parameters of the first external interface are set and current state of data exchange process is controlled by the CPU by writing control registers and reading state registers of the NAND-controller through the control interface. The NAND-controller has built-in circuit of protecting against accidental erasure/overwriting a certain area of the NAND Flash address area connected to the first external interface. Booting FW in the internal SoC RAM is automatically executed by the NAND-controller at the SoC reset, if this function is enabled by settings of the second external interface. This is achieved by dividing FW located in the NAND Flash memory into two parts: FW load program and target FW for a GNSS SoC. FW load program in turn is divided into copy code and boot code. The NAND-controller copies the FW load program from NAND Flash in buffer RAM and runs CPU to execute copy code from this RAM, during execution the CPU copies the boot code from the buffer RAM into the main SoC RAM. Upon completion of copying the CPU transits to executing the boot code from the primary RAM, in the process of which target FW from NAND is copied into the primary RAM via the buffer RAM of the NAND-controller. After completion of copying target FW the CPU starts its execution.

In one embodiment of SoC for GNSS receivers, its internal busses are divided into two groups: high-speed system busses and low-speed control busses for peripheral devices control (peripheral busses). The system busses are intended for transferring commands and data between CPU and internal RAMs of the SoC. The control busses are designed for giving the CPU access to internal registers of peripheral and auxiliary devices of the SoC.

The proposed NAND-controller includes two internal interfaces to be connected to both types of the SoC internal busses: system interface (high-speed) to connect to the system bus of the SoC and control interface (low-speed) to connect the NAND-controller to the peripheral control bus of the SoC. The SoC CPU, in this embodiment, is connected to both internal busses. NAND-controller also contains two external interfaces: a first external interface serves to connect NAND Flash memory modules, and a second external interface assigns parameters of booting target FW for SoC.

Data exchange between the SoC and NAND Flash memory modules connected to the first external interface is implemented in the form of one-sector size blocks of the selected NAND Flash memory module. A RAM buffer is used to facilitate this exchange and to read/write data from the SoC system side bus via the system interface.

The NAND-controller is controlled by a built-in FSM that generates the required sequence of commands, addresses, data and signals when exchanging data and service information between the NAND-controller and the NAND-Flash memory modules connected to the external interface. The sequence of FSM states, commands and addresses transmitted to the NAND Flash are assigned by control registers of the NAND-controller available for reading and writing through the control interface. State registers indicated in the current state of exchanging with NAND Flash, check sum values, etc. can be read via the same interface.

Alarm events in the NAND-controller are reported by setting an interrupt signal, which is sent to the system bus through the system interface and interrupt flags in the state register of the NAND-controller available for reading through the control bus.

When the CPU needs to save data from the SoC to the NAND Flash memory module, it first writes a block of data to be saved through the system bus into the RAM buffer of the NAND-controller, and then writes to the control registers of NAND-controller, writing addresses and writing commands through the control bus. After the command registers contain valid data, FSM of the NAND-controller sequentially starts to transmit a code sequence into the NAND Flash module, and then a sequential transmission of the RAM-buffer content follows.

In reading data stored in the NAND Flash module, the CPU writes to the control registers (using the control bus), where it assigns a reading address and writes a read command. After completion of the command register, the FSM of the NAND-controller starts to sequentially transmit a code sequence into the NAND Flash module, and sequential reception of data from the addressed sector of the NAND Flash module then follows. Data from the NAND Flash module is transmitted in sequential packets, whose bit size matches the physical width of the parallel bidirectional address/data bus of the first external interface of the NAND-controller. The FSM controls reception of sequential packets, calculation of next packet address in the RAM buffer and writing of the received packet into the addressed cell of the RAM buffer.

To organize step-by-step exchange of data between the NAND-controller and the NAND Flash memory modules without FSM, the NAND-controller has a set of pseudo-registers available for reading and writing through the internal control interface. The set of pseudo-registers consists of a command pseudo-register, an address pseudo-register, and data pseudo-register. Writing to the address pseudo-register causes a transmission of one address byte via the first external interface. Writing to the command pseudo-register causes a transmission of one command byte through the first external interface. Writing a data word in to the data pseudo-register generates a signal time-sequence in the first external interface to write this word in the NAND Flash memory module, and reading this register results in generating a signal time-sequence in the first external interface to read this word from the NAND Flash memory module.

The NAND-controller has an embedded module to calculate a check sum ECC (error correction code) designed for protecting a 512 byte data block. The ECC value is calculated for each 512 byte data block when the RAM buffer and first external interface exchanges this block to read/write it into the NAND Flash memory module. If the NAND Flash sector size exceeds 512 bytes, the entire data block from this sector is divided into 512 byte sub-blocks, and the ECC sum is calculated for each sub-block and stored in a special register block available for reading via the system bus of the SoC. The size of the data block supporting by the ECC calculation block is limited to 2048 bytes (four 512 byte sub-blocks). If the selected NAND Flash memory module supports dividing its internal sectors into a main part and additional parts, the NAND-controller can use additional parts of the sector to store ECC calculated for data recorded in the main sector. It can be implemented by indicating, in the control register of NAND-controller, the corresponding mode to write the sector into NAND Flash memory module. This write mode automatically adds the calculated ECC values to the output data stream of the first external interface, such that after recording, the added ECC values would be written into the additional part of the written sector, starting from its initial address.

Hardware protection of the NAND Flash memory module from accidental erasure/overwriting with the help of the WP (write protect) signal is inconvenient from the viewpoint of using such modules with SoC of GNSS receivers. This protection mechanism requires two blocks of NAND Flash memory module (they may be in the same package), where there are two physically divided WP signals. One module is designed for storing long-term value data (SoC software/FW, setting and calibrating tables of GNSS receivers, etc), the other one stores data that changes dynamically in the process of SoC operation (file system, user data, logs, etc). The proposed NAND-controller has its own mechanism of protecting an allocated area of the NAND Flash address space from accidental erasure/overwriting. To implement this mechanism, some of the registers assigning values of the initial and ending addresses of the protected area are entered into the set of NAND-controller registers. The registers are available for reading and writing using the SoC control bus through the control interface.

At the beginning of executing a write/erase command in the NAND Flash, the control FSM of the NAND-controller decodes the command and checks if it addresses the protected address space area. If yes, the command execution stops, the event flag sets in the state register of the NAND-controller, and an interrupt signal is generated. This mechanism terminates all write/erase addressing to the protected area of the NAND Flash memory on the level of the NAND-controller and allows allocation of permanent and overwritten sectors in the same array of the NAND Flash storing elements. A GNSS receiver, built on the basis of SoC integrated with the proposed NAND-controller, enables reducing the number of used NAND Flash modules without impacting receiver reliability and its total functionality.

To initiate a booting function to load SoC target FW and choose its parameters, the second external interface is used in the proposed NAND-controller. This interface includes an input signal to start booting and two input signals setting the size of automatically loaded sectors from the NAND Flash memory (512 or 2048 bytes), as well as the number of address bytes, which is transmitted into a NAND Flash memory module that contains within it a sector read-command code. Address byte values are fixed and assigned at a stage of SoC development. In one NAND-controller embodiment, the address value is 0x0000, which corresponds to automatic reading of the first NAND Flash memory sector. This is the sector which most of the NAND Flash modules manufacturers guarantee to be free of bad cells after completion of all technological and packaging procedures.

To boot target FW, the SoC embodiment with the proposed NAND-controller needs the following additional devices: a start address selector, a CPU restart signals multiplexor, and a selection circuit to select a device for booting SoC target firmware. The start address selector assigns the address of the first command being executed by the CPU, after clearing the active level of the restart signal. The CPU restart multiplexor determines which of the possible CPU restart signals generated by different devices in the SoC can lead to CPU restart. The selection circuit provides matched adjustment of the start address selector and the CPU restart multiplexor depending on the chosen method of booting target FW. If, in the embodiment, automatic booting of FW from NAND Flash using the NAND-controller has been chosen, then the address of the NAND-controller RAM buffer is set by the selector as a CPU start address, and the multiplexor connects the output restart signal from the NAND-controller to the CPU restart signal.

If the NAND-controller has been assigned as a booting device for target FW, the loading procedure starts directly after clearing the general reset signal of the NAND-controller, which is generated from the entire SoC reset signal. The FSM of the NAND-controller generates a sequence of command and address cycles to automatically read out one sector from the NAND Flash memory module. The address value of the read sector is set for the NAND-controller just before a booting procedure. The byte size of the address and the sector in bytes (512 or 2048) are assigned by states of the corresponding input signals of the second external interface. The addressed sector is fully read out into the NAND-controller buffer RAM, and then a restart block in the NAND-controller generates CPU restart signal. Duration of the generated restart signal is set such that it will be guaranteed to be detected by the reset circuits in the CPU core.

In the proposed NAND-controller there is a possibility of booting target FW as soon as a special flag is set in the control register of the NAND-controller. Flag setting is done by writing a corresponding command word in the CPU control register via the control interface, and this immediately starts booting target FW in accordance with the algorithm described above. After the procedure starts, the flag will be automatically cleared.

To automatically load FW with the help of the proposed NAND-controller, target FW needs to be divided into two parts: an FW loading program and the target FW. The FW loading program is located in the NAND Flash sector that is automatically loaded by the NAND-controller. The target FW can be located in any sequence of the NAND Flash sectors. The FW loading program, in turn, is divided into a copy code and a boot code. The FW loading program build and its arrangement in the automatically loaded sector are executed such that the first command of the copy code will be placed at the start address of the RAM buffer on the SoC system bus, after copying a boot sector from the NAND Flash to the RAM buffer. The boot code should be located entirely in the buffer RAM, such that the address of the first command for the boot code coincides with the command address, which is predetermined in the copy code.

After clearing the restart signal, the CPU starts execution from the RAM buffer of the NAND-controller and executes the copy code. During this operation, the boot code is fully copied from the RAM buffer into the main SoC RAM starting from the address assigned in the copy code. As soon as copying is completed, the CPU jumps to the start address of locating the boot code in the primary RAM and executes the boot code from the main SoC RAM.

In the beginning of executing the boot code, the SoC RAM start address is set, at which the target FW will be located. The sector address in the NAND Flash module, at which the first part of the target FW is located, is also assigned. Further, the CPU assigns a mode of operation for the NAND-controller, which provides fast copying of the target FW from the NAND Flash to the RAM buffer, and then CPU writes the copy command to copy the addressed sector from NAND Flash to the RAM buffer. If the copied sector was divided into the main and additional parts, both of them are copied. After the copying is completed, the CPU checks the ECC of the received sector (if any), comparing ECC calculated at writing the main sector part from the first external interface to the RAM buffer and the ECC value stored in the additional sector part.

If the ECC comparison does not detect any errors, the main part of the read sector is copied into the main SoC RAM. If a one-bit error is detected, this error is corrected, and then the main part of the read sector is copied into the main SoC RAM. After the copying is completed, a sector with the next portion of the target FW will be read or booting target FW is finished. In the latter case, the CPU jumps to the start address at which the first command of the target FW is located and executes the target FW.

If the ECC comparison detects two or more errors in the main part of the sector received in RAM buffer, CPU stops loading and exits into an exception handling routine.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

In the drawings:

FIG. 1 shows a part of SoC circuit that demonstrates connections between separate modules.

FIG. 2 presents a block diagram of an NAND-controller with a booting function to load firmware (FW).

Figure 5:
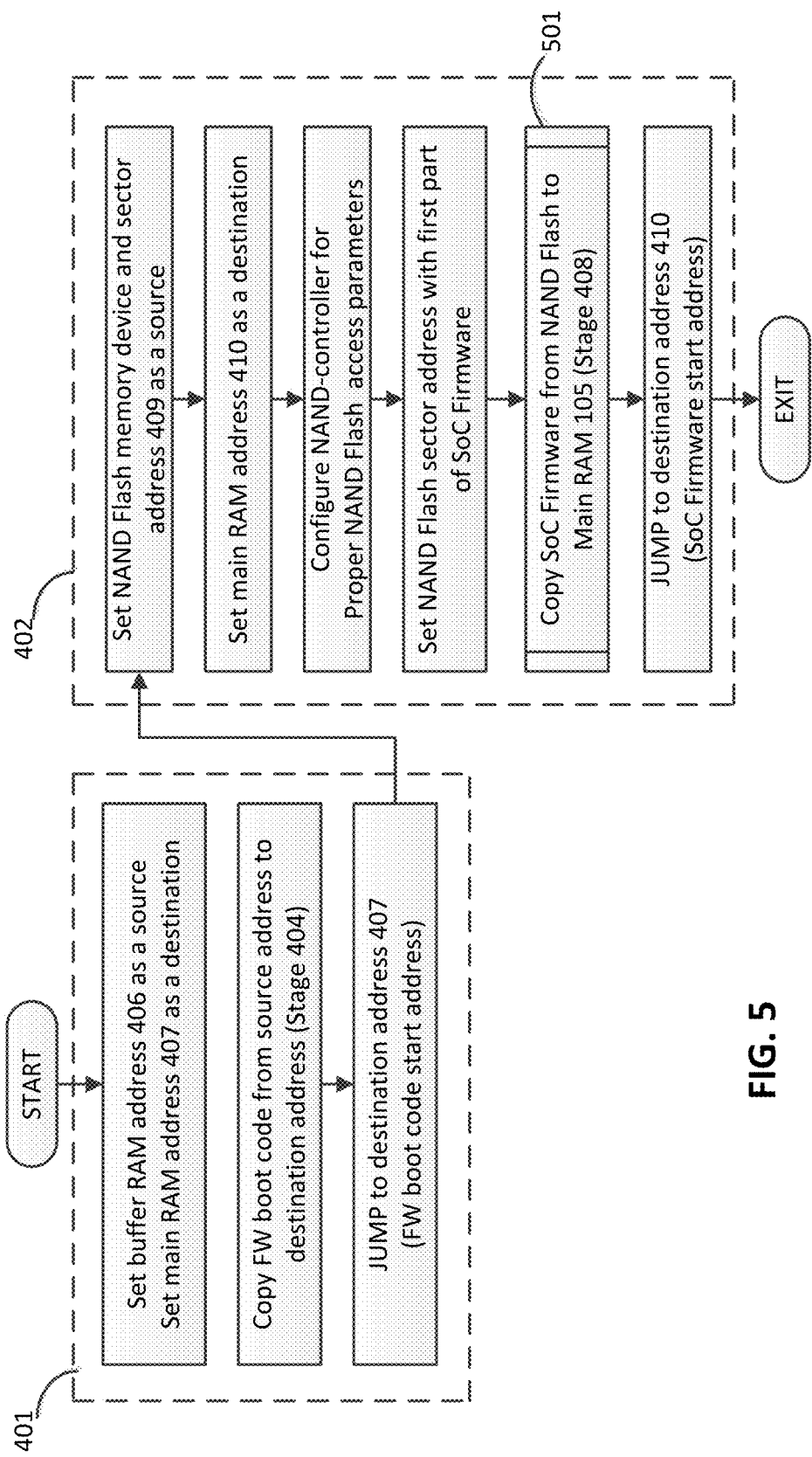

FIG. 5 presents an operation algorithm of FW loading program from a NAND Flash memory module.

Figure 6:
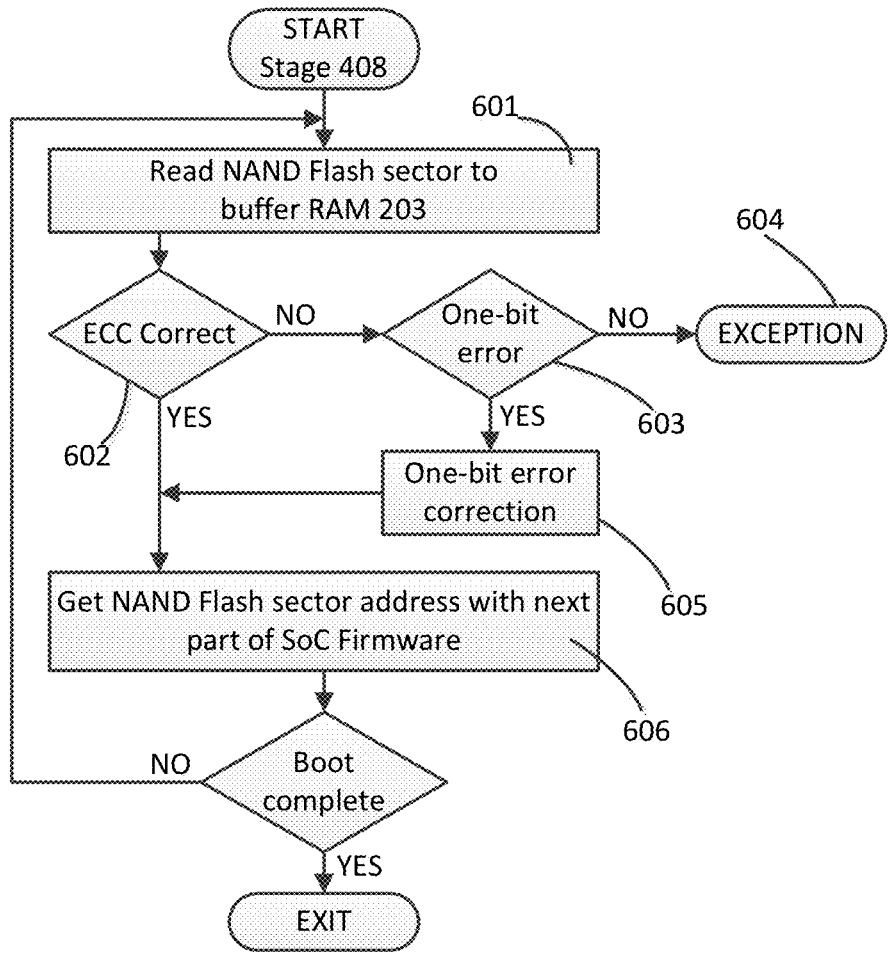

FIG. 6 shows a copy algorithm to copy the FW from a NAND Flash memory module to main SoC RAM.

DETAILED DESCRIPTION OF EMBODIMENTS OF THE INVENTION

Reference will now be made in detail to the embodiments of the present invention, examples of which are illustrated in the accompanying drawings.

Figure 1:
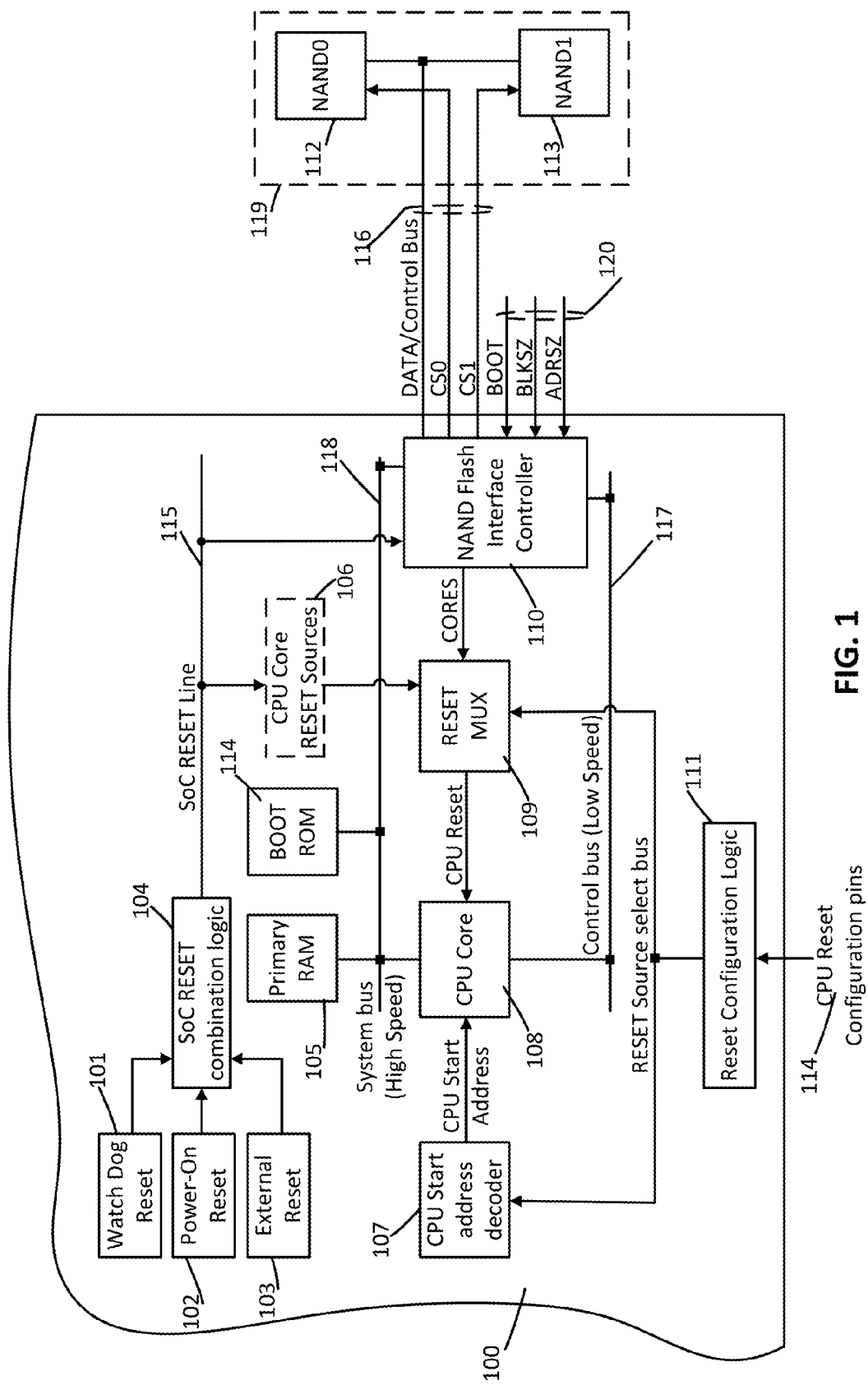

FIG. 1 shows a part of the schematics for a typical SoC 100, components of which are connected to each other with the help of two internal busses—system bus 118 (high-speed) and control bus 117 (low-speed). Internal RAM 105 is connected to the system bus 118. A ROM 114 with random access, containing an SoC booting program, is connected to the same bus. The CPU 108 and the NAND-controller 110 capable of loading FW from NAND Flash memory are connected to both internal busses.

SoC Reset signal 115 is generated by a multiplexor 104, which connects separate reset signals being generated by different devices such as watch-dog reset module 101, power-on reset module 102 or external reset module 103. The SoC Reset signal 115 is connected to all SoC modules generating individual CPU restart signals 106, including the NAND-controller 110.

The CPU restart signal 108 is generated by the multiplexor 109, which combines all possible sources of CPU individual restart signals 106, including a CPU restart signal from NAND-controller 110. Start address decoder 107 assigns a start address in the address space of the bus 118, which has a code of the first command executed by CPU after restart. The source of the CPU restart signal is set by external configuration pins 114, whose state is converted in logic block 111 into a code of the assigned source; the code being used for matched control of decoder 107 and multiplexor 108.

The External memory interface 116 of NAND-controller 110 can be connected to two NAND Flash memory modules 112 and 113. The Modules 112 and 113 can be both separate devices and logic modules with separate addressing, in a common package 119. Data, addresses and commands resulted from addressing NAND-controller 110 to the modules 112 and 113 are transmitted through a combined data/control bus which is a part of external interface 116 to connect NAND Flash memory. A choice of an addressed NAND Flash module (112 or 113) is made by setting signals CS0 and CS1 correspondingly. The signals are also parts of the first external interface 116. A configuration of the NAND-controller to automatically load SoC FW is assigned using second external interface 120 which includes input signals BOOT, BLKSZ and ADRSZ.

Figure 2:
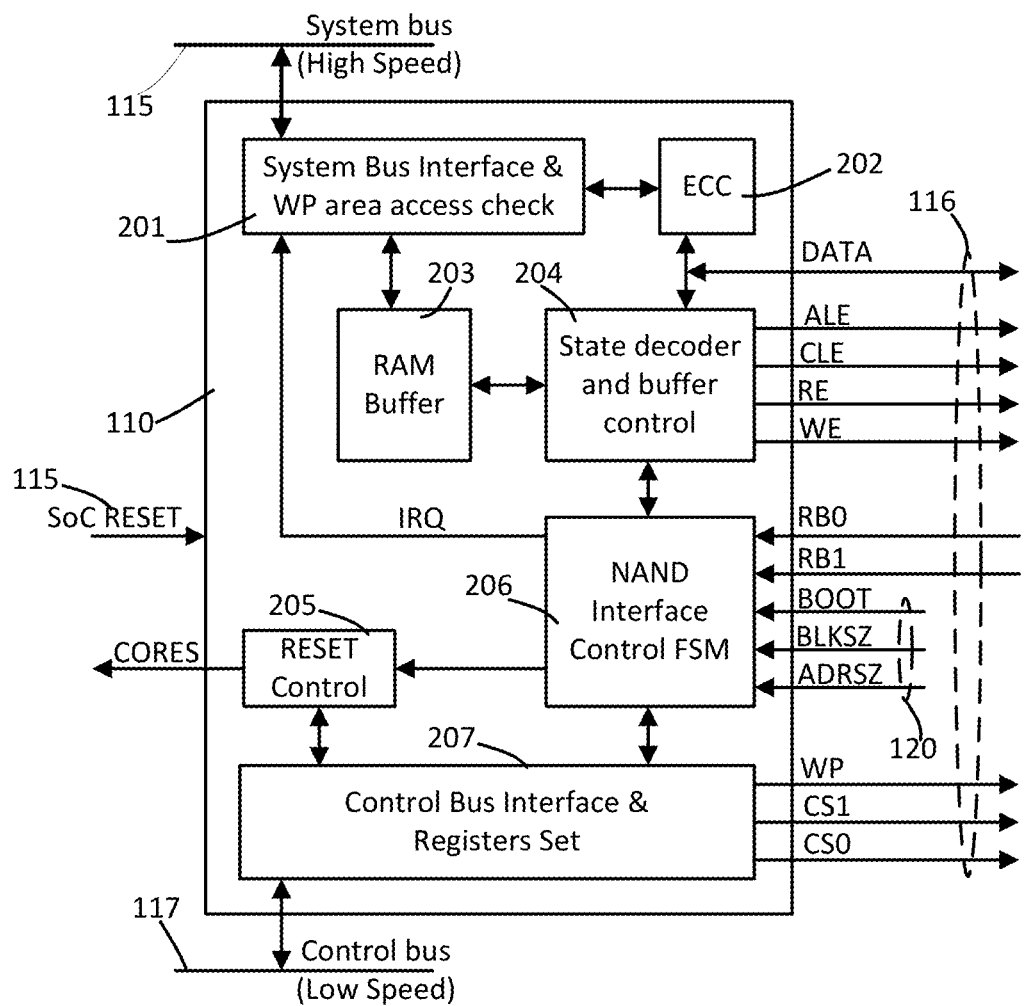

FIG. 2 presents schematics of NAND-controller 110 connected to the SoC internal system bus 118 via system interface 201 and to the internal control bus 117 via control interface 207. The interface block 207 also has a set of state/control registers of NAND-controller 110, and registers of NAND Flash address space area protected from overwriting. It generates signals CS0, CS1 for selecting NAND Flash memory modules and the signal WP to protect the selected module from erasure/overwriting.

All addressing of the NAND-controller to a NAND Flash module through the external interface 116 is controlled by FSM 206 generating interrupt signal IRQ, sequences of commands, addresses and data for the NAND Flash module according to settings of control registers in interface block 207. The same FSM decodes commands for NAND Flash modules, detects write commands, and checks these commands for attempting to write into the protected area of the NAND Flash address space. If such an attempt takes place, the write command is not executed, and block 207 generates an interrupt signal and sets a flag in the state register of the NAND-controller.

States of FSM 206 are decoded in decoder 204, which generates strobes ALE, CLE, RE, WE to control data exchange with the NAND Flash module, the strobes being parts of interface 116. The decoder 204 also provides reading data from RAM buffer 203 to send them to NAND Flash for writing, and writing data received from the NAND Flash module via interface 116 into RAM buffer 203.

The interrupt signal from the NAND controller is transmitted to the system bus 118 via the interface module 201. The CPU restart signal is generated by a module 205, which keeps the restart signal in the active state for the time needed for its detection by CPU reset circuit.

When a data packet is transferred between the NAND-controller and the NAND Flash memory module via interface 116 (write/read data), block 202 calculates a check sum ECC for this packet. If a data packet is written in the NAND Flash, the control register of block 207 can be set such that the check sum (4 bytes) is automatically transmitted just after the transmitted data packet. The latest calculated value of ECC is saved in a special 32-bit register of block 202, which is available for reading via system interface 118.

Figure 3:
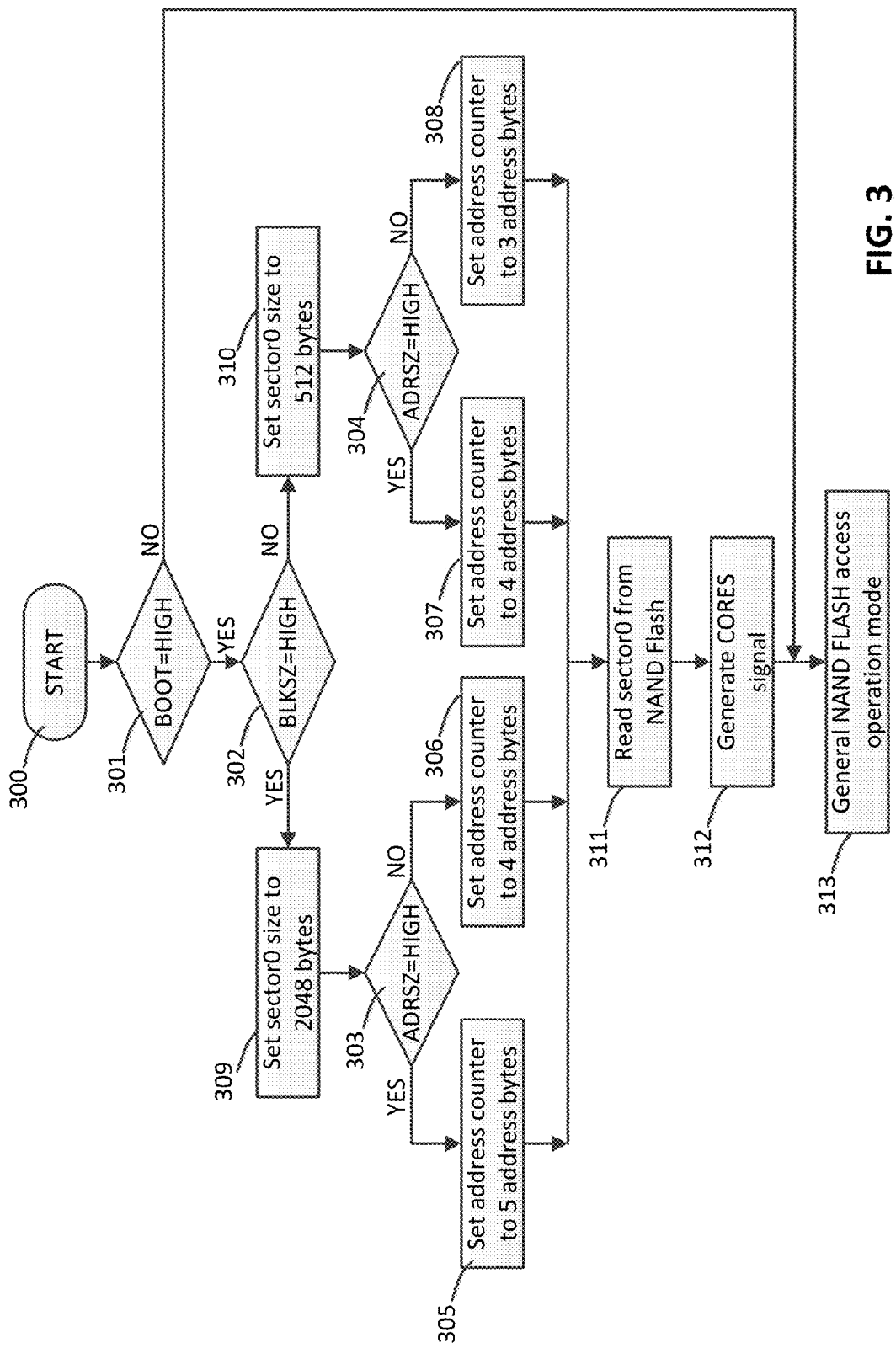
FIG. 3 shows an algorithm of operation for a NAND-controller after clearing the active level of the SoC Reset Signal.

FIG. 3 shows an algorithm of operating the NAND-controller 110 after clearing the active level of the SoC reset signal 115. The time instance of clearing the active level is designated by start block 300, and then input signal BOOT of the second external interface 120 of the NAND-controller 110 is checked. If BOOT=HIGH, the NAND-controller starts loading a sector from NAND Flash memory module, which is selected by signal CS0 (in FIG. 1, this module is indicated as position 112). Otherwise, the NAND-controller goes to the mode of standard access to NAND Flash memory under control of the SoC. A functioning NAND-controller in this mode is shown by block 313.

The size of the sector being read from NAND Flash module 112 is set by the state of signal BLKSZ of the external interface 120, and the signal is analyzed in decision box 302. Byte size of the address to read the sector which should be sent according to a standard interface protocol of interacting with the NAND Flash memory, is set by signal ADRSZ of external interface 120. If BLKSZ=LOW, the state of signal ADRSZ is analyzed in decision box 304, and the byte size of the address is determined in block 307 or 308, while NAND Flash sector size is set to 512 data bytes (block 310). If BLKSZ=HIGH, the state of signal ADRSZ is analyzed in decision box 303, and the byte size of the address is determined in block 305 or 306, while the NAND Flash sector size is set to 2048 data bytes (block 309). The value of the sector address being read from the NAND Flash at booting of the SoC is fixed and assigned at the stage of SoC development.

After address bytes and sector size are set, procedures of reading the data block from the sector of NAND Flash 112 via external interface 116, and generating CPU reset signal in block 205 will be sequentially performed. These procedures are designated in FIG. 3 by blocks 311 and 312 respectively. After CPU reset signal has been generated (procedure 312 completed), NAND-controller 110 switches to the standard mode of access to NAND Flash under control SoC, which is shown by block 313.

Figure 4:
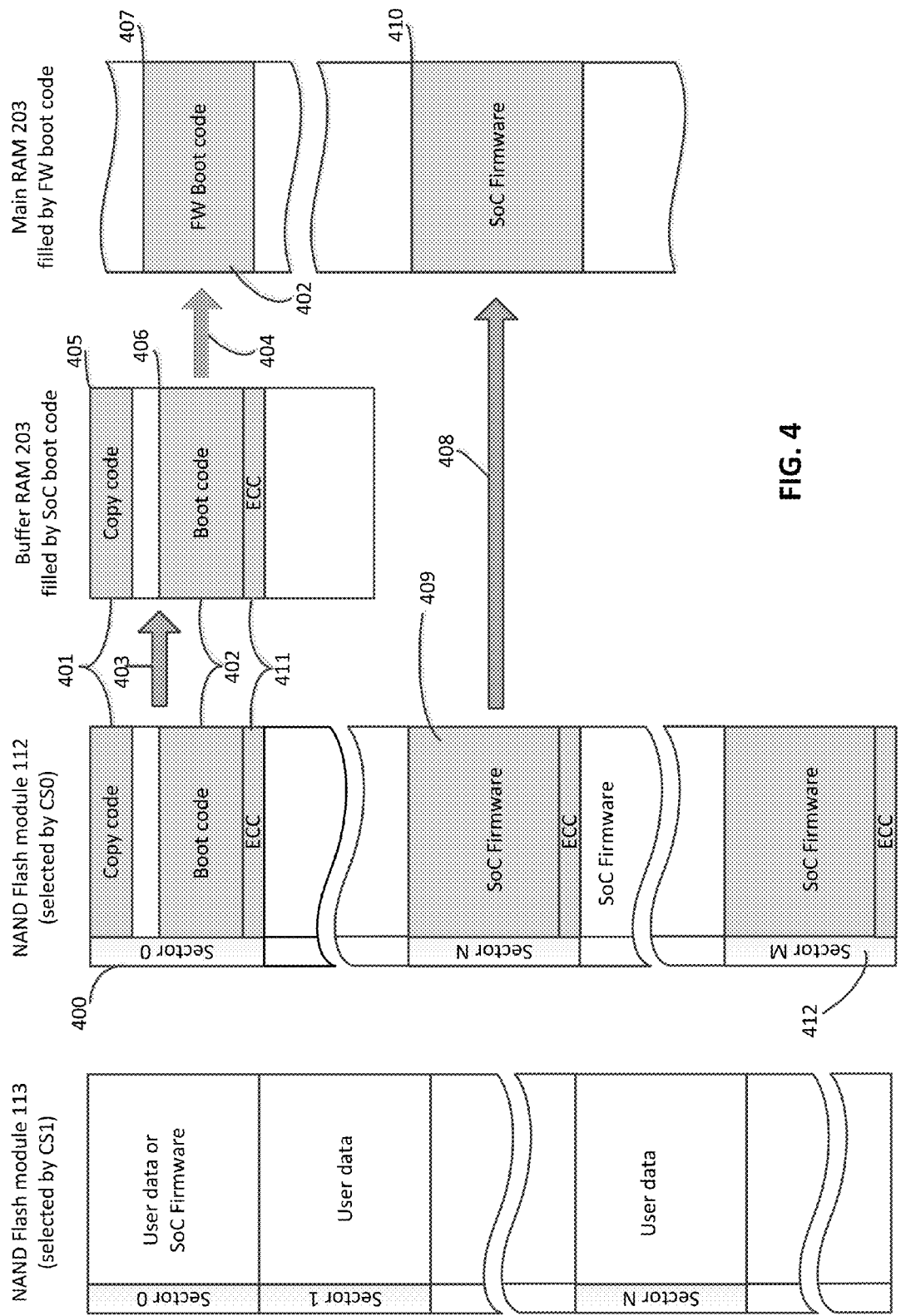
FIG. 4 shows a location of FW loading program in different memory devices at all stages of program execution.

FIG. 4 shows a location of the FW load program and target FW in the NAND Flash memory modules 112 and 113, and intermediate stages of moving the FW load program between different storing devices during all stages of load program execution. An initial copy of the SoC FW load program is located in pre-determined sector 400 of NAND Flash module 112 and consists of two parts: copy code 401 and boot code 402. The contents of sector 400 can be protected by a check sum with error correction ECC 411, which is calculated in accordance with an algorithm implemented in block 202. If ECC check sum 411 is available, it is located in an additional sector part, which is loaded after the main part containing the FW load program. A block diagram of the FW load program algorithm is shown in FIG. 5.

At a transitory stage 403 of booting SoC, the contents of sector 400 (along with the additional part) is fully copied from the NAND Flash 112 into a RAM buffer 203. Location of the content of the copied sector in the RAM buffer starts from the initial address of RAM buffer 405, which is fixed at the stage of designing the SoC in the address space of system bus 118. The same address 405 is assigned in block 107 as a CPU start address when booting from NAND Flash is selected. The initial positions of copy code 401 and boot code 402 within sector 400 are selected in the process of linking the contents in such a way that, after copying the sector into RAM buffer 203, code 401 and code 402 would be located at the previously set addresses 405 and 406, respectively. The CPU starts from initial address 405 at which there is program 401 and implements transitory copy stage 404, during which the boot code 402 is transferred from the RAM buffer 203 to the primary RAM 105. Copied boot code 402 is located in primary RAM 105 at the previously set initial address 407 in copy code 401. After completion of copying 404, the CPU 108 makes transition to address 407 of primary RAM and starts executing boot code 402, which controls the stage of copying 408.

In the process of copying, sectors with target FW located in the address space of the NAND Flash, starting from address 409 and ending at address 412, are read from NAND Flash memory module through the NAND-controller 110, and written into the primary RAM 105. Addresses and the order of reading sectors from NAND Flash, as well as the initial address of primary RAM 410 at which the first sector is copied, are set in boot code 402. As soon as copying FW sector is completed, the CPU jumps to address 410 and starts executing the SoC FW.

An area of the address space limited by sector addresses 409 and 412 is protected from accidental overwrite, which can happen with the NAND-controller. To guarantee protection, values of addresses 409 and 412 are written into the corresponding registers of the NAND-controller.

FIG. 5 shows an algorithm of FW load program from NAND Flash memory module. The algorithm consists of two blocks corresponding to copy code 401 and boot code 402 executed sequentially. At first algorithm block 401 is executed from the RAM buffer 203, and then the CPU makes transition to primary RAM 105 and continues the execution of the booting program by block 402. Copy stage 408, designed for copying the SoC FW from NAND Flash to the primary RAM, is designated in the form of functional block 501, a block diagram of which is given in FIG. 6. Upon completion of block 402, the execution of the booting program stops, and the CPU jumps to execution of SoC target FW.

FIG. 6 shows an algorithm of copying target FW from the NAND Flash memory modules into the primary RAM. Algorithm block 601 executes copying of the next NAND Flash memory sector with a code of the target FW and a code of additional part of this sector with ECC code for the main part. Upon completion of copying, the ECC value from the additional part is compared with the calculated one in comparison block 602, which was obtained in block 202 after completing reading of the main part of the copied sector. If, in block 202, there is a correct ECC value, block 606 will be executed, where the address in the NAND Flash memory will be calculated to read out next sector.

If the obtained ECC is incorrect, comparison block 603 checks if a flag of the single one-bit error is available in the read data block. If the flag is detected, the location of this erroneous bit will be calculated, and then the error will be corrected in block 605. After that, block 606 will be executed where the address in the NAND Flash memory is calculated to read out next sector.

If there is no flag of the bit error (i.e., in the read block, two or more bits contain errors), the loading procedure stops, and the CPU makes an abnormal termination 604 of algorithm block 402 and call the exception handler.

As soon as all NAND Flash sectors with target FW have been read and executed, in block 606 a "complete" flag is generated and copy stage 408 is finished.

Having thus described the different embodiments of a system and method, it should be apparent to those skilled in the art that certain advantages of the described method and apparatus have been achieved. It should also be appreciated that various modifications, adaptations, and alternative embodiments thereof may be made within the scope and spirit of the present invention. The invention is further defined by the following claims.

What is claimed is:

1. NAND Flash memory module interface controller (NAND-controller) comprising:
   a high-speed interface for connecting to internal system bus of the SoC through which commands and data are transferred between a CPU of the SoC and a primary RAM of the SoC;
   a low-speed interface for connecting to internal control bus of the SoC through which the CPU interfaces with registers of peripheral devices;
   an external interface for connecting the NAND Flash memory modules containing several chip-select output signals;
   a RAM buffer accessible for reading and writing via high-speed interface of NAND-controller and having a pre-set address on this bus;
   a computation block to calculate a check sum for each data block readable or writeable to NAND Flash memory module via NAND-controller;
   a finite state machine (FSM) to control the NAND-controller providing sequences of commands, addresses, data and control signals for the NAND Flash memory modules.

2. The NAND-controller of claim 1, further comprising a set of pseudo-registers corresponding to addresses in the address space of the low-speed interface, the pseudo-registers including:
   an address pseudo-register, writing into which using the low-speed interface causes a transmission of one address byte through the external interface for connecting the NAND Flash memory module;
   a command pseudo-register, writing into which using the low-speed interface causes a transmission of one command code byte through the external interface for connecting the NAND Flash memory module;
   a data pseudo-register, writing a data word into which generates a signal diagram of writing a data word to NAND Flash memory module through external interface and reading into which generates a signal diagram of reading a data word from NAND Flash memory module through external interface.

3. The NAND-controller of claim 2, wherein a data block in the NAND Flash memory module is divided into data sub-blocks of 512 bytes each, if data block size exceeds 512 bytes, and a checksum is calculated for each sub-block and checksum for each sub-block is stored into a separate register.

4. The NAND-controller of claim 3, further comprising:
   a plurality of memory-protective registers readable and writeable via the low-speed interface and defining the boundaries of the address space area protected from overwriting in NAND Flash memory module;
   a circuit of detection of write commands to the protected address space defined set by memory-protective registers;
   a circuit to abort the command to write to the protected area of the NAND Flash address space;
   a circuit to set the warning signal about write attempt to the protected area of the NAND Flash address space.

5. The NAND-controller of claim 4, further comprising:
   an external enabling signal to start the booting the target firmware (FW) of SoC after clearing the active level of entire SoC reset signal;
   an external interface to set the parameters of booting of target FW;
   a generator of FSM commands sequence to read a FW load program from NAND Flash memory module;
   a generator of CPU reset signal for providing the reset signal after reading the FW load program.

6. The NAND-controller of claim 5, further comprising:
   a circuit which initiate the procedure of target FW booting after set the appropriate flag in the control register of NAND-controller regardless of value of the external enabling signal which enables the booting of the target FW after clearing the active level of entire SoC reset signal;
   a circuit to clear that appropriate flag after starting the FW booting procedure.

7. A GNSS System on a Chip (SoC) device, comprising:
   a NAND-controller, including
      a high-speed interface for connecting to internal system bus of the SoC through which commands and data are transferred between a CPU of the SoC and a primary RAM of the SoC,
      a low-speed interface for connecting to internal control bus of the SoC through which the CPU interfaces with registers of peripheral devices,
      an external interface for connecting the NAND Flash memory modules containing several chip-select output signals;
      a RAM buffer accessible for reading and writing via high-speed interface of NAND-controller and having a pre-set address on this bus,
      a computation block to calculate a check sum for each data block readable or writeable to NAND Flash memory module via NAND-controller,
      a finite state machine (FSM) to control the NAND-controller providing sequences of commands, addresses, data and control signals for the NAND Flash memory modules;
   a boot device selection circuit for the GNSS SoC, configured to select the NAND-controller as a source for initial booting;
   a CPU start address selection circuit configured to assign an initial address of the RAM buffer as a start address for the CPU when the NAND-controller is the source for initial booting;
   a CPU reset signal selection circuit configured to assign the signal generated by NAND-controller as a reset signal for CPU when the NAND-controller is the source for initial booting.

8. A method of booting a GNSS System on a Chip (SoC) device comprising:
   determining a sector size and number of address bytes needed for automatic generation of a command to read a sector from an external NAND Flash memory module based on configuration signals of a NAND-controller;
   sending commands to read the sector, the commands including a sector size, a number of address bytes, and a sector address;
   reading the addressed sector containing a copy code and a boot code from a NAND Flash memory into a buffer RAM of the NAND-controller;
   generating a CPU reset signal with a start address in the initial address of the buffer RAM;

executing a copy code on the CPU from the buffer RAM and copying the boot code from the buffer RAM to a primary RAM of the GNSS SoC;

jumping to an address of the primary RAM where the boot code is located after the boot code is copied from the buffer RAM into the primary RAM, and executing the boot code from the primary RAM;

executing sector-by-sector copying of target firmware from NAND Flash memory module into primary RAM through the buffer RAM of the NAND-controller under control of the CPU executing the boot code from the primary RAM;

correcting errors during a sector-by-sector copying of firmware;

jumping to an address of the primary RAM where SoC firmware is located after the SoC firmware is copied from the NAND Flash memory and executing the SoC firmware from the primary RAM.

* * * * *

UNITED STATES PATENT AND TRADEMARK OFFICE
CERTIFICATE OF CORRECTION

PATENT NO.          : 9,053,015 B2
APPLICATION NO.     : 14/117046
DATED               : June 9, 2015
INVENTOR(S)         : Vasilyuk It is certified that error appears in the above-identified patent and that said Letters Patent is hereby corrected as shown below:

In the claims

In column 11, line 11 through column 13, line 18, claims 1-8 should read

1. A NAND Flash memory module interface controller (NAND-controller) comprising:
a high-speed interface for connecting to an internal system bus of a System-on-a-Chip (SoC) through which commands and data are transferred between a CPU of the SoC and a primary RAM of the SoC;
a low-speed interface for connecting to an internal control bus of the SoC through which the CPU interfaces with registers of peripheral devices;
an external interface for connecting NAND Flash memory modules containing several chip-select output signals;
a RAM buffer accessible for reading and writing via the high-speed interface of NAND-controller and having a pre-set address on the internal system bus;
a computation block to calculate a check sum for each data block readable or writeable to NAND Flash memory module via the NAND-controller;
a finite state machine (FSM) to control the NAND-controller providing sequences of commands, addresses, data and control signals for the NAND Flash memory modules.

2. The NAND-controller of claim 1, further comprising a set of pseudo-registers corresponding to addresses in an address space of the low-speed interface, the pseudo-registers including:
an address pseudo-register, writing into which using the low-speed interface causes a transmission of one address byte through the external interface for connecting the NAND Flash memory modules;
a command pseudo-register, writing into which using the low-speed interface causes a transmission of one command code byte through the external interface for connecting the NAND Flash memory modules;
a data pseudo-register, writing a data word into which generates a signal diagram of writing a data word to the NAND Flash memory modules through the external interface and reading into which Signed and Sealed this
Fifth Day of January, 2016

Michelle K. Lee
*Director of the United States Patent and Trademark Office* generates a signal diagram of reading a data word from the NAND Flash memory modules through the external interface.

3. The NAND-controller of claim 2, wherein a data block in the NAND Flash memory modules is divided into data sub-blocks of 512 bytes each, if data block size exceeds 512 bytes, and a checksum is calculated for each sub-block and the checksum for each sub-block is stored into a separate register.

4. The NAND-controller of claim 3, further comprising:
a plurality of memory-protective registers readable and writeable via the low-speed interface and defining boundaries of an area of the address space protected from overwriting in the NAND Flash memory modules;
a circuit of detection of write commands to the protected address space defined set by memory-protective registers;
a circuit to abort the command to write to the protected area of the address space;
a circuit to set a warning signal about write attempt to the protected area of the address space.

5. The NAND-controller of claim 4, further comprising:
an external enabling signal to start booting target firmware (FW) of the SoC after clearing an active level of an SoC reset signal;
an external interface to set parameters of the booting of the target FW;
a generator of an FSM commands sequence to read a FW load program from the NAND Flash memory modules;
a generator of a CPU reset signal for providing the SoC reset signal after reading a FW load program.

6. The NAND-controller of claim 5, further comprising:
a circuit which initiates the booting of target FW after setting a flag in a control register of the NAND-controller regardless of value of the external enabling signal after clearing the active level of the SoC reset signal;
a circuit to clear the flag after starting the booting.

7. A GNSS System on a Chip (SoC) device, comprising:
a NAND-controller, including
a high-speed interface for connecting to an internal system bus of the SoC through which commands and data are transferred between a CPU of the SoC and a primary RAM of the SoC,
a low-speed interface for connecting to an internal control bus of the SoC through which the CPU interfaces with registers of peripheral devices,
an external interface for connecting the NAND Flash memory modules containing several chip-select output signals;
a RAM buffer accessible for reading and writing via the high-speed interface of the NAND-controller and having a pre-set address on the internal system bus,
a computation block to calculate a check sum for each data block readable or writeable to the NAND Flash memory module via the NAND-controller,
a finite state machine (FSM) to control the NAND-controller providing sequences of commands, addresses, data and control signals for the NAND Flash memory modules;
a boot device selection circuit for the SoC, configured to select the NAND-controller as a source for initial booting;
a CPU start address selection circuit configured to assign an initial address of the RAM buffer as a start address for the CPU when the NAND-controller is the source for initial booting;
a CPU reset signal selection circuit configured to assign the signal generated by NAND-controller as a reset signal for CPU when the NAND-controller is the source for initial booting.

8. A method of booting a GNSS System on a Chip (SoC) device comprising:
determining a sector size and number of address bytes needed for automatic generation of a command to read a sector from an external NAND Flash memory module based on configuration signals of a NAND-controller;
sending commands to read the sector, the commands including a sector size, a number of address bytes, and a sector address;
reading the addressed sector containing a copy code and a boot code from a NAND Flash memory into a buffer RAM of the NAND-controller;
generating a CPU reset signal with a start address in the initial address of the buffer RAM;
executing a copy code on the CPU from the buffer RAM and copying the boot code from the buffer RAM to a primary RAM of the SoC;
jumping to an address of the primary RAM where the boot code is located after the boot code is copied from the buffer RAM into the primary RAM, and executing the boot code from the primary RAM;
executing sector-by-sector copying of target firmware from the NAND Flash memory module into primary RAM through the buffer RAM of the NAND-controller under control of the CPU executing the boot code from the primary RAM;
correcting errors during a sector-by-sector copying of firmware;
jumping to an address of the primary RAM where SoC firmware is located after the SoC firmware is copied from the NAND Flash memory and executing the SoC firmware from the primary RAM.